US010290515B2

United States Patent
Lin et al.

(10) Patent No.: US 10,290,515 B2
(45) Date of Patent: May 14, 2019

(54) WAFER LEVEL CHIP PACKAGING METHOD

(71) Applicant: SJ SEMICONDUCTOR (JIANGYIN) CORPORATION, Jiangyin (CN)

(72) Inventors: Chengchung Lin, Jiangyin (CN); Yuedong Qiu, Jiangyin (CN)

(73) Assignee: SJ SEMICONDUCTOR (JIANGYIN) CORPORATION, Jiang Yin ( * ) Notice: Subject to any disclaimer, the term of this patent is extended or adjusted under 35 U.S.C. 154(b) by 0 days.

(21) Appl. No.: 15/752,180

(22) PCT Filed: May 20, 2016

(86) PCT No.: PCT/CN2016/082846
§ 371 (c)(1),
(2) Date: Feb. 12, 2018

(87) PCT Pub. No.: WO2017/024846
PCT Pub. Date: Feb. 16, 2017

(65) Prior Publication Data
US 2018/0240683 A1    Aug. 23, 2018

(30) Foreign Application Priority Data

Aug. 10, 2015 (CN) .......................... 2015 1 0486611

(51) Int. Cl.
*H01L 21/56* (2006.01)
*H01L 23/00* (2006.01)
(Continued)

(52) U.S. Cl.
CPC ............ *H01L 21/568* (2013.01); *H01L 21/56* (2013.01); *H01L 21/561* (2013.01);
(Continued)

(58) Field of Classification Search
None
See application file for complete search history.

(56) References Cited

U.S. PATENT DOCUMENTS

2018/0240683 A1*  8/2018  Lin ........................ H01L 21/568

FOREIGN PATENT DOCUMENTS

| CN | 101604638 A | 12/2009 |
|---|---|---|
| CN | 102376590 A | 3/2012 |

(Continued)

OTHER PUBLICATIONS

PCT International Search Report for application PCT/CN2016/082846 dated Aug. 26, 2016.

*Primary Examiner* — Jack S Chen
(74) *Attorney, Agent, or Firm* — Alston & Bird LLP

(57) ABSTRACT

A wafer level chip packaging method, comprising: 1) providing a carrier and forming a bonding layer on a surface of the carrier; 2) forming a dielectric layer on a surface of the bonding layer; 3) attaching each of semiconductor chips, with its front face facing down, to a surface of the dielectric layer; 4) packaging each of the semiconductor chips by using an injection molding process; 5) separating the bonding layer and the dielectric layer to remove the carrier and the bonding layer; 6) forming a redistribution layer for the semiconductor chips based on the dielectric layer; and 7) performing a reballing reflow process on the redistribution layer to form micro bumps. As a result, contamination in the semiconductor chips from the packaging process is greatly controlled, thereby improving the rate of finished products and the electrical property of the semiconductor chips.

10 Claims, 3 Drawing Sheets

(51) Int. Cl.
*H01L 21/78* (2006.01)
*H01L 23/29* (2006.01)
*H01L 21/683* (2006.01)
*H01L 21/768* (2006.01)
*H01L 23/15* (2006.01)

(52) U.S. Cl.
CPC .... *H01L 21/6835* (2013.01); *H01L 21/76802* (2013.01); *H01L 21/76873* (2013.01); *H01L 21/76877* (2013.01); *H01L 21/78* (2013.01); *H01L 23/29* (2013.01); *H01L 24/11* (2013.01); *H01L 24/19* (2013.01); *H01L 24/20* (2013.01); *H01L 24/96* (2013.01); *H01L 23/15* (2013.01); *H01L 2224/04105* (2013.01); *H01L 2224/12105* (2013.01); *H01L 2224/19* (2013.01); *H01L 2224/32225* (2013.01); *H01L 2224/92144* (2013.01)

(56) References Cited

FOREIGN PATENT DOCUMENTS

| | | |
|---|---|---|
| CN | 104485320 A | 4/2015 |
| CN | 105161465 A | 12/2015 |
| WO | WO 2017/024846 A1 | 2/2017 |

* cited by examiner

WAFER LEVEL CHIP PACKAGING METHOD

CROSS REFERENCES TO RELATED APPLICATIONS

This application is a US national stage of PCT/CN2016/082846, filed on May 20, 2016, which claims the benefit of priority to Chinese Patent Application No. CN201510486611.6, entitled "wafer level chip packaging method" and filed with the Chinese Patent Office on Aug. 10, 2015, the contents of which are incorporated herein by reference in its entirety.

TECHNICAL FIELD

The present invention relates to the technical field of semiconductor manufacturing, and more particularly, relates to a wafer level chip packaging method.

BACKGROUND

With the rapid development of the integrated circuit manufacturing industry, the requirements for integrated circuit packaging technologies are also increasing. Existing packaging technologies include ball grid array packaging (BGA), chip scale packaging (CSP), wafer level packaging (WLP), three-dimensional packaging (3D), and system packaging (SiP) and so on. Among them, the wafer level packaging (WLP) is gradually adopted by most semiconductor manufacturers due to its excellent advantages, all or most of its process steps are completed on a silicon wafer when the pre-process has been completed, and finally the wafer is directly cut into separate devices. Wafer level packaging (WLP) has its unique advantages: ① package processing efficiency is high because multiple wafers can be processed at the same time; ② the advantages of flip-chip packaging, i.e., being light, thin, short and small, are achieved; ③ in comparison with the pre-process, only two processes, i.e., making redistribution layers (RDL) of pins and fabricating bumps, are added, and the rest of the WLP are all natural processes; and ④ the multiple tests in the traditional packaging are reduced. Therefore, the world's major IC packaging companies have invested in the research, development and production of such WLP. The current disadvantages of WLP lie in low pin count, no standardization and high cost. In addition to technologies required for the pre-process, such as metal deposition, photolithography and etching, the key technologies involved in WLP further include RDL technology and bump fabrication technology. In general, the on-chip terminal pads are square aluminum layers routed to the periphery of the die. To accommodate WLP for a wider pad pitch of SMT two-stage packaging, these pads need to be redistributed so that these pads are arranged into an array on the active surface of the chip, rather than being arranged at the periphery of the chip, which requires the redistribution layer (RDL) technology.

A redistribution layer (RDL) is an interface between a chip and a package in a flip-chip assembly. The redistribution layer is an additional metal layer that consists of a core metal top wiring and is used to bind the I/O pads of a bare chip outward to other locations such as bump pads. The bumps are usually arranged in a grid pattern, with each bump having two bonding pads (one being on the top, and one being on the bottom) that are respectively connected to a redistribution layer and a package substrate.

In the existing fan-out chip packaging technology, a semiconductor chip is usually pasted directly onto a film, and then the semiconductor chip is transferred to a supporting substrate or another support part. After the semiconductor chip is transferred, the film needs to be removed. However, adhesive residue on the film tends to remain on the surface of the semiconductor chip when the film is removed, which may contaminate the semiconductor chip.

In order to overcome the above defects, one existing solution is: first fabricating a redistribution layer directly on the surface of a silicon supporting substrate, and then fabricating welding bumps on the surface of a semiconductor chip, aligning the semiconductor chip to the silicon supporting substrate and packaging the semiconductor chip on the surface of the silicon supporting substrate, and finally reducing the thickness of the silicon supporting substrate. The advantage of this process is that the semiconductor chip can be prevented from being contaminated by the adhesive of the film. However, since the redistribution layer is fabricated on a silicon supporting substrate, the packaging of the semiconductor chip requires very high alignment accuracy to ensure the electrical property, and thus it is difficult to realize this process, and rate of finished products may decrease easily.

In view of the above, it is necessary to provide a wafer level chip packaging method that can effectively prevent the contamination of semiconductor chips.

SUMMARY

In view of the above shortcomings, the present invention is to provide a wafer level chip packaging method for solving the problem that a semiconductor chip is easily contaminated during the current process of semiconductor chip packaging.

The present invention provides a wafer level chip packaging method, comprising: 1) providing a carrier and forming a bonding layer on a surface of the carrier; 2) forming a dielectric layer on a surface of the bonding layer; 3) attaching each of semiconductor chips, with its front face facing down, to a surface of the dielectric layer; 4) packaging each of the semiconductor chips by using an injection molding process; 5) separating the bonding layer and the dielectric layer to remove the carrier and the bonding layer; 6) forming a redistribution layer for the semiconductor chips based on the dielectric layer; and 7) performing a reballing reflow process on the redistribution layer to form micro bumps.

As a preferred solution of the wafer level chip packaging method of the present invention, the semiconductor chips are fan-out semiconductor chips.

As a preferred solution of the wafer level chip packaging method of the present invention, the carrier includes one of glass, semiconductor, metal and rigid polymer.

As a preferred solution of the wafer level chip packaging method of the present invention, the bonding layer and the dielectric layer are made from different materials, and the bonding layer and the dielectric layer can be completely separated.

As a preferred solution of the wafer level chip packaging method of the present invention, an adhesive force sufficient to fix each of the semiconductor chips on the surface of the dielectric layer is provided between the dielectric layer and the semiconductor chips.

As a preferred solution of the wafer level chip packaging method of the present invention, the bonding layer includes one of an adhesive tape, adhesive glue prepared by a spin-coating process or epoxy resin, and the dielectric layer includes one of silicon dioxide and silicon nitride.

As a preferred solution of the wafer level chip packaging method of the present invention, the packaging material used in the injection molding process of step 4) includes one of silica gel and an epoxy resin.

As a preferred solution of the wafer level chip packaging method of the present invention, step 6) includes the following steps: 6-1) forming through holes in the dielectric layer by using a photolithography process and an etching process, wherein the through holes correspond to the electrical lead-out of the semiconductor chips; 6-2) filling each of the through holes with metal conductors to form connecting through holes; and 6-3) forming a redistribution layer connected with the connecting through holes on the surface of the dielectric layer.

Further, step 6-3) includes the following steps: 6-3a) forming photoresist patterns on the surface of the dielectric layer; 6-3b) depositing or sputtering a seed layer on the surface of the dielectric layer based on the photoresist patterns; 6-3c) electroplating metal conductors based on the seed layer to form metal wires; and 6-3d) removing the photoresist patterns to form a redistribution layer.

As described above, the wafer level chip packaging method of the present invention has the following beneficial effects: according to the present invention, by fabricating a dielectric layer between the bonding layer and the semiconductor chips, the problem i.e., the contamination of the semiconductor chips, brought about by the fact that the bonding layer is directly bonded to the semiconductor chips, can be avoided. By means of the packaging method of the present invention, the situation where the semiconductor chips are contaminated during packaging process can be greatly controlled, thereby improving the rate of finished products and the electrical property of the semiconductor chips. The invention has simple steps, can effectively improve the yield rate and performance of the product, and has broad application prospect in technical field of semiconductor manufacturing.

DESCRIPTIONS OF REFERENCE NUMBERS

| | |
|---|---|
| 11 | Carrier |
| 12 | Bonding layer |
| 13 | Dielectric layer |
| 14 | Semiconductor chip |
| 15 | Packaging material |
| 16 | Redistribution layer |
| 17 | Micro bump |
| S11-S1 | Step 1)-step 7) |

DETAILED DESCRIPTION OF THE PREFERRED EMBODIMENTS

The implementation modes of the present invention will be described below through specific examples. One skilled in the art can easily understand other advantages and effects of the present invention according to content disclosed in the description. The present invention may also be implemented or applied through other different specific implementation modes. Various modifications or variations may be made to all details in the description based on different points of view and applications without departing from the spirit of the present invention.

Reference is made to FIGS. 1-8. It should be noted that, the figures provided in the embodiment merely illustrate the basic concept of the present invention in a schematic manner, and therefore the figures only illustrate the components related to the present invention but are not drafted according to the numbers, shapes and sizes of components in actual implementation, the types, quantity and ratios of components can be a random change, and its component layout pattern may also be more complex.

As shown in FIG. 1 to FIG. 8, this embodiment provides a wafer level chip packaging method, comprising the following steps.

Figure 1:
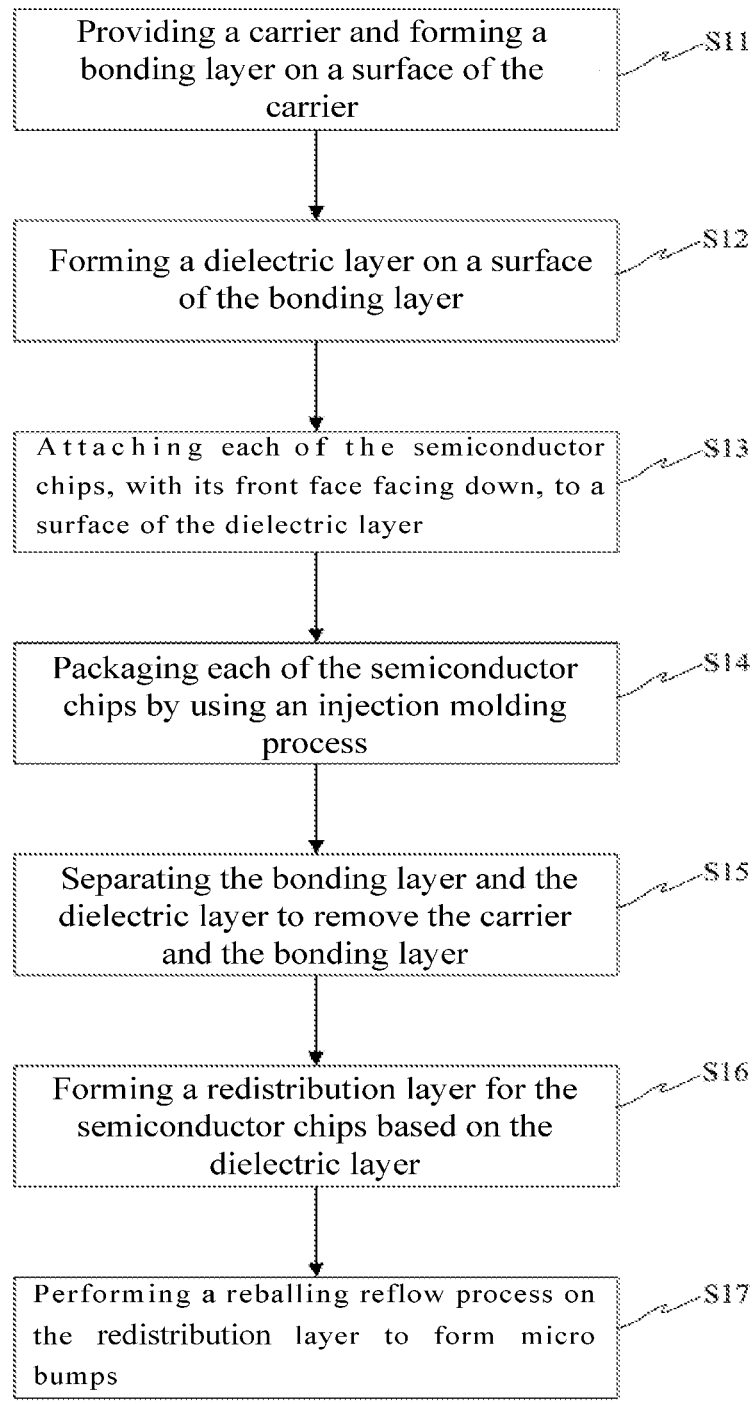
FIG. 1 shows a schematic flow chart of a wafer level chip packaging method according to the present invention.
Figure 2:
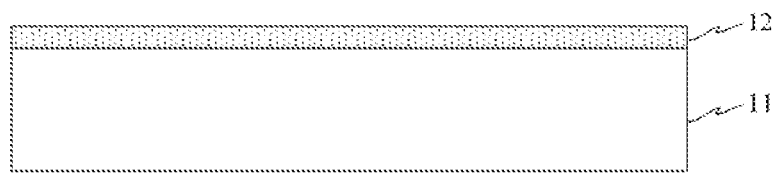
FIG. 2 to FIG. 8 show structural schematic diagram presented by various steps of the wafer level chip packaging method according to the present invention.

As shown in FIG. 1 and FIG. 2, step 1) S11 is first performed to provide a carrier 11 and form a bonding layer 12 on a surface of the carrier 11.

The carrier 11 may provide a rigid structure or substrate for the subsequent fabrication of the bonding layer 12 and a dielectric layer 13. For example, materials of the carrier 11 may be one of glass, semiconductor, metal and rigid polymer having a suitable shape. In this embodiment, the carrier 11 is glass.

The bonding layer 12 is preferably made of a binding material having a smooth surface and is capable of allowing the formation of the dielectric layer 13 on its surface; the bonding layer 12 must have a bonding force with the dielectric layer 13 to ensure that the dielectric layer 13 will not fall off accidentally by itself in a subsequent process. In addition, the bonding layer 12 can have a strong bonding force with the carrier 11. In general, the bonding force of the bonding layer 12 with the carrier 11 needs to be greater than that with the dielectric layer 13. In the subsequent process, the bonding layer 12 is used as a separation layer between the dielectric layer 13 and the carrier 11. As an example, the bonding layer 12 may be one of an adhesive tape, adhesive glue prepared by a spin-coating process or epoxy resin. In this embodiment, the bonding layer 12 is an adhesive tape.

Figure 3:
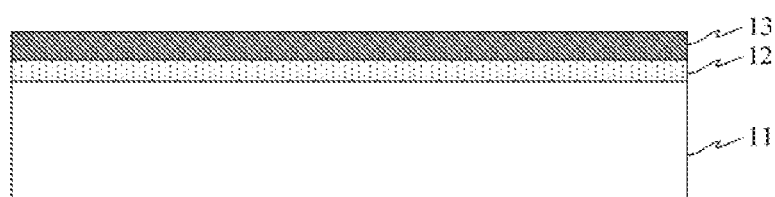

As shown in FIG. 1 and FIG. 3, then step 2) S12 is performed to form the dielectric layer 13 on the surface of the bonding layer 12.

As an example, the bonding layer 12 and the dielectric layer 13 are made from different materials, and the bonding layer 12 can be completely separated from the dielectric layer 13. In addition, there must be an adhesive force between the dielectric layer 13 and the semiconductor chips 14, sufficient to fix each of the semiconductor chips 14 on the surface of the dielectric layer 13.

As an example, the dielectric layer 13 includes one of silicon dioxide and silicon nitride. In this embodiment, the dielectric layer 13 is silicon dioxide, which can be fabricated on the bonding layer 12 by a method such as vapor deposition. Of course, other dielectric layers 13 are equally applicable, and the dielectric layer is not limited to the examples enumerated here.

Figure 4:
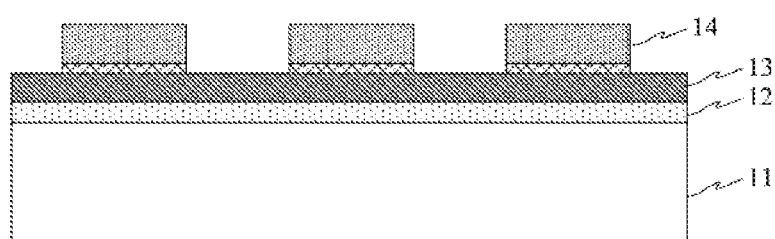

Next, as shown in FIG. 1 and FIG. 4, step 3) S13 is performed to attach each of the semiconductor chips 14, with its front face facing down, to the surface of the dielectric layer 13.

In this embodiment, the semiconductor chips 14 are fan-out semiconductor chips 14. Of course, in other embodiments, the packaging method of the present invention can also be used for mounting devices such as memory devices, display devices, input devices, discrete components, power supplies, and voltage regulators, and is not limited to several examples enumerated here.

As an example, the number of the semiconductor chips 14 may be in a range of one to the number of semiconductor chips 14 that can be carried by one wafer. In this embodiment, the number of the semiconductor chips 14 is the number of semiconductor chips 14 that can be carried by one wafer.

Figure 5:
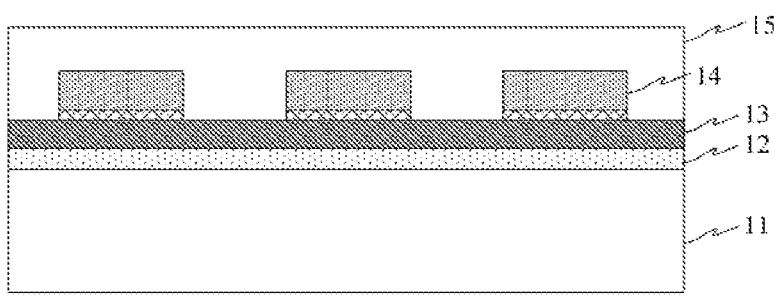

As shown in FIG. 1 and FIG. 5, step 4) S14 is then performed to package the semiconductor chips 14 by an injection molding process.

As an example, the packaging material 15 used in the injection molding process includes one of silica gel and an epoxy resin. In this embodiment, the packaging material 15 is silica gel. The semiconductor chips 14 subjected to the injection molding process can be further fixed between the silica gel and the dielectric layer 13 to greatly enhance its stability.

Figure 6:
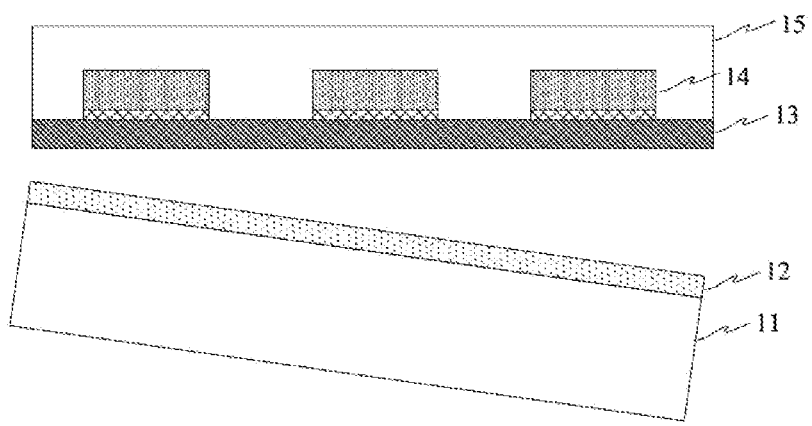

As shown in FIG. 1 and FIG. 6, step 5) S15 is then performed to separate the bonding layer 12 and the dielectric layer 13 to remove the carrier 11 and the adhesive layer 12.

In this embodiment, the bonding layer 12 and the dielectric layer 13 can be separated by a tear method to remove the carrier 11 and the adhesive layer 12. Compared with the traditional thinning processes, such as grinding and etching, the separation method of the present invention is very simple, easy to operate, and can greatly reduce the cost of the process.

Figure 7:
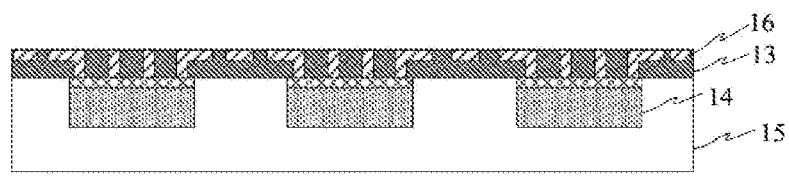

As shown in FIG. 1 and FIG. 7, step 6) S16 is then performed to form a redistribution layer 16 for the semiconductor chips 14 based on the dielectric layer 13.

As an example, the following steps are specifically included:

Step 6-1) is performed to form through holes in the dielectric layer 13 by using a photolithography process and an etching process, wherein the through holes correspond to the electrical lead-out of the semiconductor chips 14.

Step 6-2) is performed to fill each of the through holes with metal conductors to form connecting through holes.

As an example, the metal conductors are made of a metal material such as Cu, Al, or the like, and may be filled in the through holes by a process such as deposition, plating or the like, to form connecting through holes. In this embodiment, the metal conductors are made of Cu.

Step 6-3) is performed to form a redistribution layer connected with the connecting through holes on the surface of the dielectric layer.

In this embodiment, step 6-3) specifically includes the following steps:

Step 6-3a) is performed to form photoresist patterns on the surface of the dielectric layer 13.

Step 6-3b) is performed to deposit or sputter a seed layer on the surface of the dielectric layer 13 based on the photoresist patterns. In this embodiment, the seed layer is a Ti/Cu layer.

Step 6-3c) is performed to electroplate metal conductors based on the seed layer to form metal wires.

Step 6-3d) is performed to remove the photoresist patterns to form a redistribution layer 16.

Figure 8:
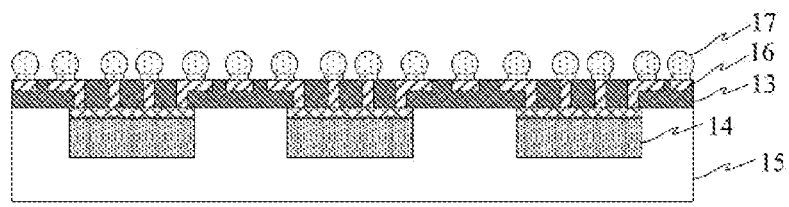

As shown in FIG. 1 and FIG. 8, step 7) S17 is finally performed to carry out the reballing reflow process on the redistribution layer 16 to form micro bumps 17.

Specifically, a conductive material, such as a gold-tin alloy, is formed at a position corresponding to each of the connecting through holes, and then micro bumps 17 are formed by a reballing reflow process to form electrical connection and lead-out with a subsequent supporting structure.

As described above, the present invention provides a wafer level chip packaging method, comprising: 1) providing a carrier 11 and forming a bonding layer 12 on the surface of the carrier 11; 2) forming a dielectric layer 13 on the surface of the bonding layer 12; 3) attaching each semiconductor chip 14, with its front face facing down, to the surface of the dielectric layer 13; 4) packaging each of semiconductor chips by using an injection molding process; 5) separating the bonding layer 12 and the dielectric layer 13 to remove the carrier 11 and the bonding layer 12; and 6) forming a redistribution layer for the semiconductor chips 14 based on the dielectric layer 13. According to the present invention, by means of fabricating the dielectric layer 13 between the bonding layer 12 and the semiconductor chips 14, the problem i.e., the contamination of the semiconductor chips 14, brought about by the fact that the bonding layer 12 is directly bonded to the semiconductor chips 14, can be avoided. By means of the packaging method of the present invention, the situation where the semiconductor chips are contaminated during packaging can be greatly controlled, thereby improving the rate of finished products and the electrical property of the semiconductor chips. The invention has simple steps, can effectively improve the yield rate and performance of the product, and has broad application prospect in technical field of semiconductor manufacturing. Therefore, the present invention effectively overcomes various disadvantages of the prior art and has a high value in industrial use.

The above-mentioned embodiments are just used for exemplarily describing the principle and effects of the present invention instead of limiting the present invention. One skilled in the art may make modifications or changes to the above-mentioned embodiments without departing from the spirit and the scope of the present invention. Therefore, all equivalent modifications or changes made by one skilled having common knowledge in the art without departing from the spirit and technical concept disclosed by the present invention shall be still covered by the claims of the present invention.

What is claimed is:

1. A wafer level chip packaging method, comprising the following steps:
   1) providing a carrier and forming a bonding layer on a surface of the carrier;
   2) forming a dielectric layer on a surface of the bonding layer;
   3) attaching a front face of each of a plurality of semiconductor chips to a surface of the dielectric layer;
   4) packaging the plurality of semiconductor chips by using an injection molding process;
   5) removing the bonding layer and carrier from the dielectric layer; and
   6) forming a redistribution layer of the plurality of semiconductor chips in the dielectric layer.

2. The wafer level chip packaging method according to claim 1, further comprising step 7): performing a reballing reflow process on the redistribution layer to form micro bumps.

3. The wafer level chip packaging method according to claim 1, wherein each of the plurality of semiconductor chips is a fan-out semiconductor chip.

4. The wafer level chip packaging method according to claim 1, wherein a material of the carrier comprises one of glass, semiconductor, metal and rigid polymer.

5. The wafer level chip packaging method according to claim 1, wherein the bonding layer and the dielectric layer are made from different materials, and wherein the bonding layer and the dielectric layer can be completely separated.

6. The wafer level chip packaging method according to claim 1, wherein an adhesive force sufficient to fix the plurality of semiconductor chips on the surface of the dielectric layer is provided between the dielectric layer and the plurality of semiconductor chips.

7. The wafer level chip packaging method according to claim 1, wherein the bonding layer comprises one of an adhesive tape, adhesive glue prepared by a spin-coating process or epoxy resin, and wherein the dielectric layer comprises one of silicon dioxide and silicon nitride.

8. The wafer level chip packaging method according to claim 1, wherein the packaging material used in the injection molding process of step 4) comprises one of silica gel and an epoxy resin.

9. The wafer level chip packaging method according to claim 1, wherein step 6) comprises the following steps:
   6-1) forming through holes in the dielectric layer by using a photolithography process and an etching process, wherein the through holes aligned to the electrical lead-outs of the plurality of semiconductor chips;
   6-2) filling each of the through holes with metal conductors to form connecting through holes; and
   6-3) forming the redistribution layer connected with the connecting through holes on the surface of the dielectric layer.

10. The wafer level chip packaging method according to claim 9, wherein step 6-3) further comprises the following steps:
   6-3a) forming photoresist patterns on the surface of the dielectric layer;
   6-3b) depositing or sputtering a seed layer on the surface of the dielectric layer aligning with the photoresist patterns;
   6-3c) electroplating metal conductors on the seed layer to form metal wires; and
   6-3d) removing the photoresist patterns to form the redistribution layer.

* * * * *